US009340901B2

(12) United States Patent
Schaefer et al.

(10) Patent No.: US 9,340,901 B2
(45) Date of Patent: May 17, 2016

(54) METHOD AND DEVICE FOR PRODUCING CLASSIFIED HIGH-PURITY POLYCRYSTALLINE SILICON FRAGMENTS

(75) Inventors: Marcus Schaefer, Traunstein (DE); Reiner Peach, Neuoetting (DE); Hanns Wochner, Burghausen (DE)

(73) Assignee: Wacker Chemie AG, Munich (DE)

( * ) Notice: Subject to any disclaimer, the term of this patent is extended or adjusted under 35 U.S.C. 154(b) by 1868 days.

(21) Appl. No.: 12/375,457

(22) PCT Filed: Jul. 13, 2007

(86) PCT No.: PCT/EP2007/057238

§ 371 (c)(1),
(2), (4) Date: Jan. 28, 2009

(87) PCT Pub. No.: WO2008/012215

PCT Pub. Date: Jan. 31, 2008

(65) Prior Publication Data

US 2010/0001106 A1    Jan. 7, 2010

(30) Foreign Application Priority Data

Jul. 28, 2006  (DE) .................. 10 2006 035 081

(51) Int. Cl.
| | |
|---|---|
| C30B 29/06 | (2006.01) |
| B02C 21/00 | (2006.01) |
| B02C 23/08 | (2006.01) |
| C30B 15/00 | (2006.01) |

(52) U.S. Cl.
CPC ............. *C30B 29/06* (2013.01); *B02C 21/00* (2013.01); *B02C 23/08* (2013.01); *C30B 15/00* (2013.01); *B02C 2210/02* (2013.01)

(58) Field of Classification Search
USPC .................................... 241/79.1, 19
See application file for complete search history.

(56) References Cited

U.S. PATENT DOCUMENTS

| | | | | |
|---|---|---|---|---|
| 4,123,294 | A | * | 10/1978 | Hanink .................. 148/220 |
| 4,190,422 | A | * | 2/1980 | Hitzrot, Jr. ............... 51/309 |
| 4,525,336 | A | | 6/1985 | Griesshammer et al. |
| 5,165,548 | A | | 11/1992 | Dumler et al. |
| 5,667,158 | A | * | 9/1997 | Bullock et al. ............. 241/33 |
| 6,063,697 | A | | 5/2000 | Wolf et al. |
| 6,265,683 | B1 | | 7/2001 | Flottmann et al. |

(Continued)

FOREIGN PATENT DOCUMENTS

| | | |
|---|---|---|
| DE | 195 29 518 A1 | 2/1996 |
| DE | 197 41 465 A1 | 3/1999 |

(Continued)

OTHER PUBLICATIONS

Suzuki, Y., Cartering Wear of Cemented Carbides in Relationship Carbon Contents in Tools and Machined Steels, Dec. 1, 1969.*

*Primary Examiner* — Shelley Self
(74) *Attorney, Agent, or Firm* — Brooks Kushman P.C.

(57) ABSTRACT

Polysilicon rods from the Siemens process are crushed into fragments and further processed to fragments having very low metal contamination in an economical manner by purposefully fabricating parts contacting the polysilicon from materials which cause high metal contamination, and removing the metal contamination by a cleaning bath or baths tailored to the particular metal contamination. By this process, economical materials previously scrupulously avoided, such as low alloy steel, can be used for crushers, conveyors, and other polysilicon-contacting parts of the crushing and classifying system.

5 Claims, 2 Drawing Sheets

(56) References Cited

U.S. PATENT DOCUMENTS

| | | |
|---|---|---|
| 6,309,467 B1 | 10/2001 | Wochner et al. |
| 6,313,013 B1 * | 11/2001 | Flottmann et al. ............ 438/472 |
| 6,375,011 B1 | 4/2002 | Flottmann et al. |
| 2005/0034430 A1 | 2/2005 | Holzlwimmer et al. |
| 2006/0070569 A1 | 4/2006 | Andrejewski et al. |
| 2006/0243834 A1 | 11/2006 | Schantz et al. |

FOREIGN PATENT DOCUMENTS

| | | |
|---|---|---|
| DE | 10 2005 019 873 A1 | 11/2006 |
| EP | 0 137 306 A2 | 4/1985 |
| EP | 0 497 497 A2 | 8/1992 |
| EP | 1 043 249 B1 | 11/2001 |
| EP | 1 338 682 A2 | 8/2003 |
| EP | 1 391 252 A1 | 2/2004 |
| EP | 1 334 907 B1 | 4/2004 |
| JP | 08-067510 A | 3/1996 |
| JP | 08-067511 A | 3/1996 |
| JP | 10-308336 A | 11/1998 |
| JP | 11-168076 A | 6/1999 |
| JP | 2000-088537 A | 3/2000 |
| JP | 2000-128693 A | 5/2000 |
| JP | 2000-313513 A | 11/2000 |
| JP | 2006-122902 A | 5/2006 |

* cited by examiner

METHOD AND DEVICE FOR PRODUCING CLASSIFIED HIGH-PURITY POLYCRYSTALLINE SILICON FRAGMENTS

CROSS-REFERENCE TO RELATED APPLICATION

This application is the U.S. national phase of PCT Appln. No. PCT/EP2007/057238 filed Jul. 13, 2007 which claims priority to German application DE 10 2006 035 081.2 filed Jul. 28, 2006.

BACKGROUND OF THE INVENTION

1. Field of the Invention

The invention relates to a method and a device for producing classified polysilicon fragments with high purity.

2. Description of the Related Art

Highly pure polycrystalline silicon, referred to below as polysilicon, is used inter alia as a starting material for the production of electronic components and solar cells. It is obtained by thermal decomposition of a gas containing silicon or a gas mixture containing silicon. This process is referred to as chemical vapor deposition (CVD). On a large scale, this process is carried out in so-called Siemens reactors. The polysilicon is thereby created in the form of rods. The polysilicon rods are extracted and comminuted by means of manual methods or using a machine. The coarse polysilicon fragments thus obtained are comminuted further by using crushers. Mechanical crushing methods are described, for example, in EP 1 338 682 A2. The polysilicon fragments are subsequently classified by a screening method, for example a mechanical screening method as known from EP 1 043 249 B1, or optical sorting as is known for example from U.S. Pat. No. 6,265,683 B1. The polysilicon fragments are transported from one device to the next by means of delivery devices, for example conveyor belts, conveyor troughs, vibrating conveyors or transport containers. Each step of processing the polysilicon (for example crushing or sorting) is adapted individually on the basis of the respective specific tasks. In particular, the requirements of the materials used for the device have been adapted individually for each processing or transport step. For the individual devices, the surfaces coming in contact with the polysilicon fragments have preferably been made of low-contamination material for the polysilicon fragments, or of silicon. It is furthermore prior art, when an individual device consists of another material, to clean the polysilicon fragments by a cleaning method (EP 1 338 682 A2 or DE 197 41 465). Depending on the chemicals used, these cleaning methods are to a differing degree capable of removing the metals contaminating the polysilicon from the surface of the polysilicon.

SUMMARY OF THE INVENTION

It is an object of the present invention to provide a simple and economical method for producing highly pure classified polysilicon fragments. These and other objects are achieved by a method in which polysilicon from the Siemens method is comminuted and classified by means of a device comprising comminution tools and a screening device, and the polysilicon fragments thus obtained are cleaned by means of a cleaning bath, characterized in that the crusher and the screening device essentially have a surface, coming in contact with the polysilicon, which contaminates the polysilicon fragments only with extraneous particles that are subsequently removed selectively by the cleaning bath.

DETAILED DESCRIPTION OF THE PREFERRED EMBODIMENTS

Figure 1:
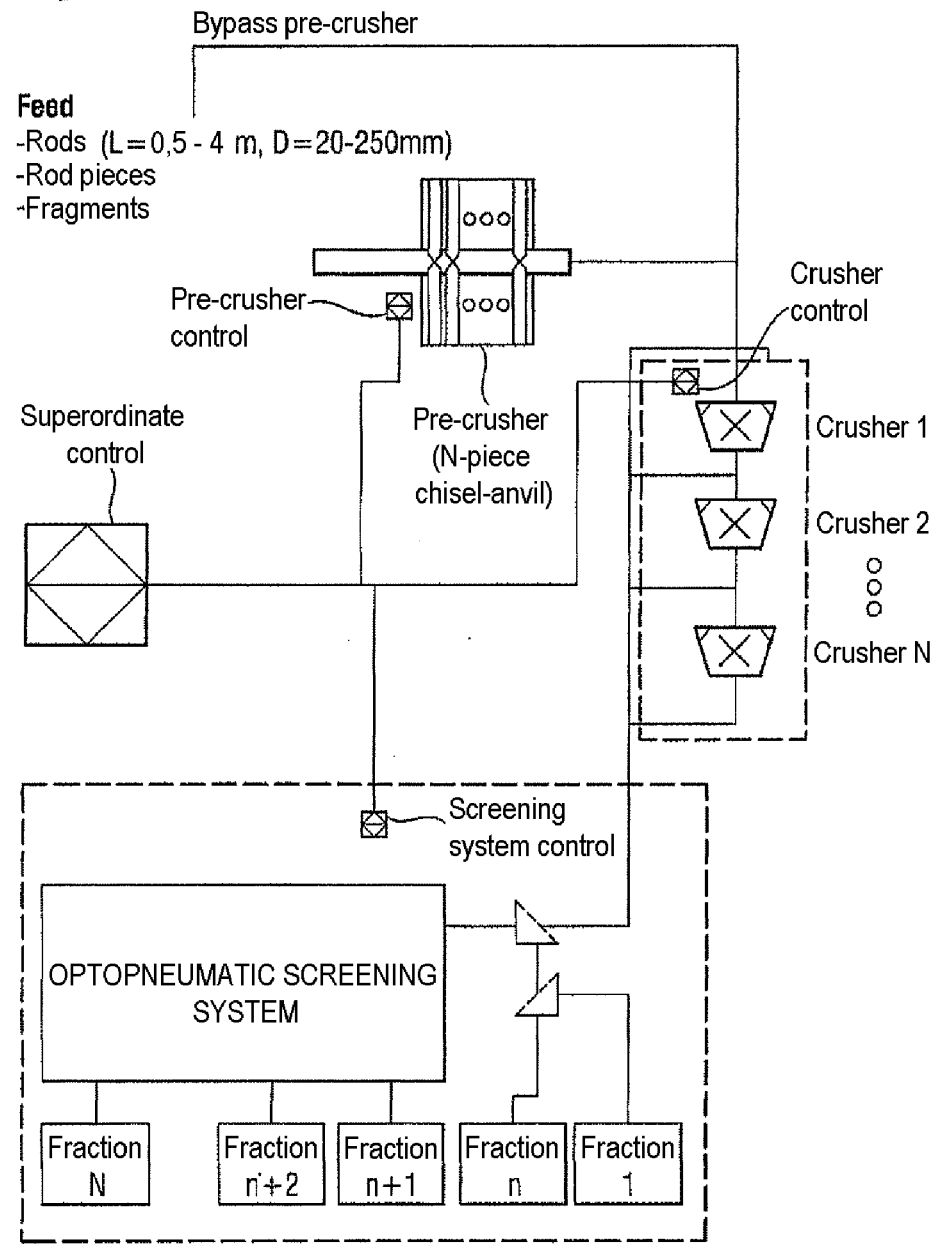
FIG. 1 shows the device used in Example 2.

The polysilicon from the Siemens method is either coarse polysilicon fragments or a polysilicon rod from the Siemens reactor.

Preferably the surfaces of all devices, which come in contact with the polysilicon when extracting the polysilicon rod from the Siemens reactor and during transport to the crushing, also consist essentially of a material which contaminates the polysilicon fragments only with extraneous particles that are subsequently removed selectively by the cleaning bath. The method according to the invention therefore preferably also comprises the extraction of a polysilicon rod from a Siemens reactor and its transport to the crushing.

Preferably the surfaces of all devices, which are used during the transport of the classified comminuted polysilicon fragments to the packaging as well as for packaging the classified comminuted polysilicon fragments, are also essentially made of a material which contaminates the polysilicon fragments only with extraneous particles that are subsequently removed selectively by the cleaning bath. The method according to the invention therefore preferably also comprises transport of the classified comminuted polysilicon and packaging of the classified comminuted fragments.

Most preferably, the cleaned and classified polysilicon fragments are immediately packaged manually or automatically in PE double bags, as described in EP-B-1 334 907.

Crushers are preferably used as comminution tools. A pre-comminuter, as is described in DE 10 2005 019 873, may furthermore be used in the method according to the invention. The surface of the pre-comminuter as well as the surface of further optionally used auxiliary processing means, which come in contact with the polysilicon, are then likewise made of a material which contaminates the polysilicon fragments only with extraneous particles that are subsequently removed selectively by the cleaning bath.

In contrast to the known method, the method according to the invention does not attempt to avoid metallic contamination of the polysilicon fragments during the comminution; rather, it combines selective contamination of the polysilicon fragments essentially throughout all the systems with a material which can be removed simply by the cleaning bath. In the known methods, conversely, care has been taken to keep the contamination of the material to be processed (for example the polysilicon) as low as possible in each processing step. It has been assumed that the cleaning is commensurately more favorable in respect of cost and quality when the input contamination of the material to be cleaned is lower.

The invention therefore also relates to a method for producing highly pure classified polysilicon fragments from a polysilicon rod, in which all the surfaces that come in contact with the polysilicon are made essentially of a material which is removed simply and fully from the classified polysilicon fragments during the subsequent cleaning.

In the context of the present invention, "essentially a surface coming in contact with the polysilicon, made of a material" means that at least 90%, preferably at least 95% of the contamination of the polysilicon fragments before the cleaning (which equates to the input contamination for the cleaning method) is caused by this material. More preferably, this formulation means that the surfaces of all the devices coming in contact with the polysilicon fragments consist of this material.

Surprisingly, it has been found that even with very high input contamination of the classified polysilicon fragments, a high purity from metallic contamination and therefore a high quality of the cleaned classified polysilicon fragments can be achieved with an economical cleaning bath if the contamination of the polysilicon fragments in the scope of the process is carried out selectively so that it can be removed by a cleaning bath matched to this contamination.

The selective contamination of the polysilicon fragments is achieved by preferably selecting the material for the surface of the parts of the devices which touch the polysilicon, from the group of low-wear plastic, stainless steel, hard metal, ceramic, quartz, low-alloy steel, medium-alloy steel, high-alloy steel and silicon.

The material is more preferably a low-alloy steel with an alloy content of less than 5% by weight, or a medium-alloy steel with an alloy content z 5% by weight but less than 10% by weight, or a high-alloy steel with an alloy content z 10% or a hard metal, preferably tungsten carbide, or silicon, preferably polysilicon.

For cost reasons, it is most preferable to use a low-alloy steel with an alloy content of less than 5% by weight. Surprisingly, it has been possible for such a material to be used essentially for all the devices, and in particular for transport boxes or even large cast parts, for example a roll crusher, without manufacturing technology or mechanical restrictions.

A low-alloy steel is preferably a steel with a total alloy content of <5% by weight of the elements Cr, Co, Mn, Ni, Si, W, Al, Be, Cu, Mo, Nb, Pb, Ta, Ti, V, Zr, P, S, N, Ce and B.

In the method according to the invention the constituents of the device for processing the fragments which contaminate the polysilicon fragments is matched selectively to the cleaning bath. This allows advantages both with respect to the quality of the product (surface contamination after cleaning) and with respect to the cleaning costs of the classified polysilicon fragments and the processing costs for the comminution and classification.

Preferably, the cleaning bath for cleaning the polysilicon fragments contains pre-cleaning in at least one stage with an oxidizing cleaning solution which contains the compounds hydrofluoric acid, hydrochloric acid and hydrogen peroxide, main cleaning in a further stage with a cleaning solution which contains nitric acid and hydrofluoric acid, and hydrophilization of the polysilicon fragments by means of a further stage with an oxidizing cleaning solution.

The invention also relates to a method for producing highly pure classified polysilicon fragments from a polysilicon rod from Siemens deposition, in which the polysilicon rod is comminuted and classified by manual auxiliary means (for example extraction eighths, manual hammers, transport boxes) and machine devices, such as a pre-comminuter, or one or more crushers, one or more sorting instruments, one or more conveyor troughs, and the polysilicon fragments thus obtained are cleaned by means of a cleaning bath, characterized in that all surfaces of the manual auxiliary means and the machine devices which are responsible for 90%, preferably 95%, and most preferably 100% of the input contamination for the cleaning, consist of a material which contaminates the polysilicon fragments only with extraneous particles that are subsequently removed selectively by the cleaning bath.

In the method according to the invention the cleaning process described in DE 197 41 465 A1, or a cleaning method as described in the examples of the present application, is preferably used in combination with devices whose surface coming in contact with the polysilicon fragments consist of a low-alloy steel having an alloy content of less than 5% by weight. Surprisingly, the polysilicon fragments could be cleaned very well in this combination, even when using this economical material, despite very high input contamination.

More economical and better cleaning results may also be achieved using other methods of the prior art (as known for example from EP 1 338 682 A2, p. 8, paragraphs 0054 to 0058 or from U.S. Pat. No. 6,309,467), if care is taken during the treatment, in particular the crushing, classification and delivery of the polysilicon, that essentially devices are used whose surface consists of a material that is removed selectively from the polysilicon by means of the respective cleaning bath.

The invention furthermore relates to a device for carrying out the method according to the invention, comprising device subunits for crushing, delivering, classifying and cleaning polysilicon, wherein the surface of all device subunits used for crushing, delivering and classifying the polysilicon, which comes in contact with the polysilicon, is essentially made of a material which can be removed simply and during the subsequent cleaning of the classified polysilicon fragments.

For the device according to the invention, the comments made regarding the method apply similarly.

Most preferably, the device comprises an instrument for feeding coarse polysilicon fragments into a crusher system, the crusher system, an instrument for delivery from the crusher system to a sorting system, and the sorting system for classifying the polysilicon fragments.

Preferably, the crushing system comprises roll crushers or jaw crushers, more preferably roll crushers, most preferably spiked roll crushers.

Preferably, the sorting system consists of a multistage mechanical screening system and a multistage optoelectronic separating system.

Most preferably, a pre-comminuter is furthermore a part of the device. The pre-comminuter preferably consists of a base and comminution chisels and counter-chisels, the base, comminution chisels and counter-chisels being movable so that a polysilicon rod to be comminuted, lying on the base, or a polysilicon fragment to be comminuted, can be fitted between the chisels so that all the chisels in the vicinity of the polysilicon rod or the polysilicon fragment have contact with the polysilicon rod (polysilicon fragment), and the comminution chisels before or after the polysilicon rod (polysilicon fragment) can be moved further in their working axis to a safety distance from the counter-chisels. Such a device is described, for example, in DE 10 2005 019 873.

The device for carrying out the method according to the invention preferably also comprises device subunits for extraction and transport.

Preferably all surfaces of the subsystems which come in contact with polysilicon in the individual processing steps, consist of a non-low-contamination steel, preferably a low-alloy steel.

Most preferably, the device subunits for extraction and the crushing tools (for example manual hammers, crushing shells, crushing hammers, crushing jaws), the conveyor troughs and chutes in an optoelectronic separating system and the screening surfaces consist of a non-low-contamination steel, preferably a low-alloy steel. These materials lead to selective metallic contamination which can be removed rapidly, simply and to the required extent by means of the described cleaning process.

Despite the simple and economical embodiment and the concomitant higher input contamination of the comminuted classified silicon fragments, in combination with a cleaning process such as is described in DE 197 41 465, the device makes it possible to produce polysilicon fragments which have semiconductor quality in all size fractions.

In another embodiment of the device according to the invention, all system parts coming in contact with polysilicon have a surface made of a low-contamination material, or they consist of a low-contamination material. The term low-contamination material is intended to mean preferably a material selected from the group of hard metals, silicon and low-wear plastics.

As a hard metal, WC is preferred, most preferably by hard metal plating of the system parts touching the product, for example the tools (rolls, crushing plates, balls) of the crushers, although titanium nitride may also be employed as a hard metal material; polyurethanes, polyethylenes and PTFE may preferably be used as low-wear plastics.

In combination with this device, the subsequent cleaning of the classified polysilicon fragments must be selectively adapted to the respective contamination. For an embodiment in which the surface of the devices consists of WC hard metals, for instance, cleaning with the following composition is necessary: 3.4% by weight $KH_2PO_4$, 1.3% by weight KOH and 3.3% by weight $K_3(Fe(CN)_6)$ in fully deionized water.

The following examples serve to explain the invention further.

Example 1

In a plurality of batches, the effect of different processing tools or the effect of different contaminating materials on the metal surface values of polysilicon fragments were studied.

Example 1a: a polysilicon rod from a Siemens reactor was comminuted as is conventional in the prior art, manually with low contamination using a hammer made of hard metal (tungsten carbide) into fragments with an edge length of about 80 mm (comparative example).

Example 1b: a polysilicon rod from a Siemens reactor was comminuted into fragments with an edge length of about 80 mm by means of a roll crusher with crushing shells made of low-alloy tool steel (total alloy content of the elements Cr, Co, Mn, Ni, Si, W, Al, Be, Cu, Mo, Nb, Pb, Ta, Ti, V, Zr, P, S, N, Ce and B<5% by weight).

Example 1c: the fragments produced according to Example 1a were additionally abraded with stainless steel (V4A with 18% chromium, 63% iron, 2.5% Mo, 13.5% Ni, 3% other elements) in order to simulate delivery of the fragments with a conveyor trough made of V4A stainless steel (comparative example).

Example 1d: a polysilicon rod from a Siemens reactor was comminuted by means of a jaw crusher with crushing shells made of chromium hard steel (10% chromium, 89% iron, 1% other elements) into fragments with an edge length of about 80 mm (comparative example).

Samples were respectively taken from the total quantity of polysilicon fragments produced as described above, each of which comprised 20 typical fragments measuring about 80 mm. The metal surface values were determined by means of chemical stripping of the surface and subsequent analysis of the stripped solution by ICPMS (inductively coupled plasma mass spectroscopy). Table 1 shows the average values of the measurement and therefore the input contamination of the fragments in subsequent cleaning.

TABLE 1

| | Average values in pptw | | | | | | | | | | |
|---|---|---|---|---|---|---|---|---|---|---|---|
| Ex: | Fe | Cr | Ni | Na | Zn | Al | Cu | Mo | Ti | W | K |
| 1a | 2258 | 75 | 60 | 2087 | 224 | 440 | 45 | 17 | 64 | 1478 | 727 |
| 1b | 839586 | 1545 | 1010 | 3045 | 846 | 725 | 2345 | 339 | 164 | 139 | 1491 |
| 1c | 1250325 | 180234 | 35245 | 2750 | 650 | 340 | 3500 | 20 | 120 | 80 | 950 |
| 1d | 950000 | 75000 | 85000 | 4300 | 270 | 265 | 650 | 35 | 145 | 60 | 1250 |

These polysilicon fragments were subsequently cleaned by the following process:

1. Pre-cleaning: pickling for 20 minutes in an aqueous $HF/HCl/H_2O_2$ solution containing, besides water, 5% by weight HF, 8% by weight HCl and 3% by weight $H_2O_2$ at 25±/−5 degrees. The silicon etching removal was about 0.02 μm.
2. Washing for 5 minutes at 22 degrees.
3. Main cleaning: etching for 5 minutes at 8 degrees in an aqueous $HF/HNO_3$ solution containing, besides water, 3% by weight HF and 65% by weight $HNO_3$. The etching removal was about 12 μm.
4. Washing for 5 minutes at 22 degrees.
5. Hydrophilization for 5 minutes in an aqueous $HCl/H_2O_2$ solution containing, besides water, 8% by weight HCl and 2% by weight $H_2O_2$ at 22 degrees.
6. Washing at 22 degrees.
7. Drying with class 100 ultrapure air at 80 degrees.

With this cleaning method, the metal surface values listed in Table 2 were obtained.

TABLE 2

| | Average values in pptw from the determination of 20 fragments each | | | | | | | | | | |
|---|---|---|---|---|---|---|---|---|---|---|---|
| Ex: | Fe | Cr | Ni | Na | Zn | Al | Cu | Mo | Ti | W | K |
| 1a | 28 | 4 | 2 | 40 | 13 | 58 | 2 | 1 | 22 | 21 | 15 |
| 1b | 26 | 7 | 8 | 38 | 26 | 36 | 5 | 1 | 19 | 6 | 16 |
| 1c | 63 | 18 | 8 | 36 | 23 | 45 | 9 | 1 | 23 | 6 | 21 |
| 1d | 125 | 135 | 10 | 31 | 23 | 38 | 3 | 2 | 19 | 4 | 19 |

Result:

The use, known from the prior art, of low-contamination materials, as is described in Example 1a, gives polysilicon fragments with low metallic contamination on the surface after the cleaning. Disadvantageously, these materials are not technically usable for all system parts (for example crushing shells with spikes). When producible, such system parts are very expensive and therefore uneconomical. Hard metal (tungsten carbide) is furthermore dissolved more poorly by the process, which may be seen from the somewhat increased tungsten values for Example 1a in Table 1.

The use, known from the prior art, of stainless steel or chromium hard steel tools for comminuting polysilicon fragments, as described in Examples 1c and 1d, gives polysilicon fragments with increased iron and chromium values after the cleaning. Despite their greater hardness and corrosion resistance compared with low-alloy steel (Example 1b) such materials are therefore unsuitable as comminution material for the cleaning described above, and for example even for (short) conveyor troughs.

Although the use, described in Example 1b, of crushing tools made of a low-alloy tool steel with alloy contents of less than 5% leads to stronger contamination of the polysilicon fragments and therefore higher input contamination in the cleaning, this contamination can nevertheless be reduced by the cleaning to the same low values as achieved by comminution with low-contamination manual methods known according to the prior art (1a).

In contrast to Example 1a, economical machine comminution is therefore possible with the inventive matching of cleaning methods for the comminuted and classified silicon and material selection of the device for comminution, delivery and classification, and it is possible to employ a more economical tool steel which can be used in a versatile way in terms of method technology (for example for crushing jaws).

Example 2

A polysilicon rod from a Siemens reactor was comminuted and sorted into different sizes by means of a device according to FIG. 1, all the system parts contaminating the product being made of low-alloy steel as described in Example 1b.

The system parts coming in contact with the product were the chisels, the half-shells of the pre-comminuter which form the base, the crushing shells and cladding of the roll crusher, all the conveyor troughs and the cladding in the mechanical screens and in the optopneumatic sorting modules.

The poly-Si fragments thus produced, with a max edge length of 250 mm, were subsequently cleaned in a cleaning system as described in DE 197 41 465 and summarized below:
1. Pre-cleaning: pickling for 20 minutes in an aqueous $HF/HCl/H_2O_2$ solution containing, besides water, 5% by weight HF, 8% by weight HCl and 3% by weight $H_2O_2$ at 25+/− 5 degrees. The silicon etching removal was about 0.02 μm.
2. Washing for 5 minutes.
3. Main cleaning: etching for 5 minutes at 8 degrees in an aqueous $HF/HNO_3$ solution containing, besides water, 3% by weight HF and 65% by weight $HNO_3$. The etching removal was about 12 μm.
4. Washing for 5 minutes.
5. Hydrophilization for 5 minutes in an aqueous $HCl/H_2O_2$ solution containing, besides water, 8% by weight HCl and 2% by weight $H_2O_2$ at 22 degrees.
6. Washing at 22 degrees.
7. Drying with class 100 ultrapure air at 80 degrees.

Figure 2:
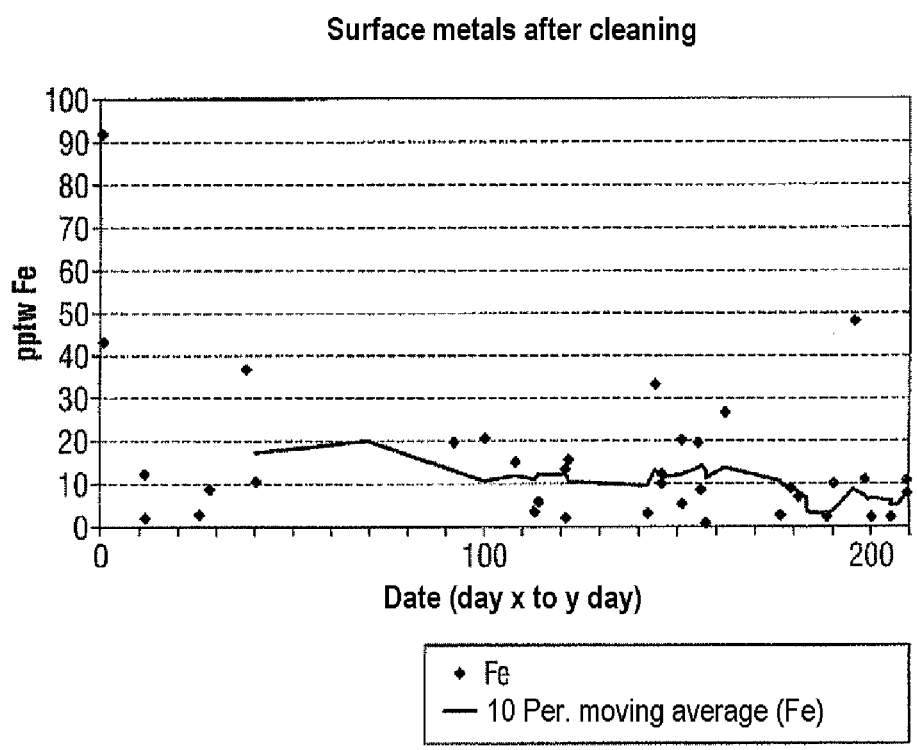
FIG. 2 shows the results of the Fe determination after cleaning from Example 2.

Despite use of the "non-low-contamination" material (low-alloy tool steel) and an input contamination in the cleaning which is more than a factor of 100 higher compared with conventional methods (see the Fe values of Examples 1a to 1b in Table 1), the desired purity was surprisingly achieved by the above cleaning. A random sample (=fragment measuring about 80 mm) was respectively studied for metallic contamination at various time intervals by means of the method described above. The result of these measurements is represented in FIG. 2. The other metallic contaminations were at the level represented for Fe in FIG. 2 (semiconductor compatible).

The invention claimed is:

1. A method for producing highly pure classified polysilicon fragments, comprising comminuting polysilicon into fragments by means of a device comprising comminution tools, classifying the fragments by a screening device, and cleaning the polysilicon fragments thus obtained in a cleaning bath, wherein the comminution tools and the screening device have surfaces of low alloy steel which contact the polysilicon and contaminate the polysilicon fragments only with extraneous particles that are subsequently removable selectively by a cleaning bath, and cleaning to remove the extraneous particles, and wherein the polysilicon to be comminuted has been prepared by the Siemens process.

2. The method of claim 1, wherein the surfaces of all devices used for crushing, delivering/transporting and classifying polysilicon which contact the polysilicon are made of a material which is removed simply and fully from the classified polysilicon fragments during the subsequent cleaning of the classified polysilicon fragments.

3. The method of claim 1, wherein the material is a low-alloy steel with an alloy content of less than 5% by weight.

4. The method of claim 1, wherein cleaning comprises:
   a pre-cleaning in at least one stage with an aqueous oxidizing cleaning solution which contains hydrofluoric acid, hydrochloric acid and hydrogen peroxide,
   a main cleaning in a further stage with an aqueous cleaning solution which contains nitric acid and hydrofluoric acid, and
   a hydrophilization of the polysilicon fragments by means of a further stage with an oxidizing cleaning solution.

5. The method of claim 3, wherein cleaning comprises:
   a pre-cleaning in at least one stage with an aqueous oxidizing cleaning solution which contains hydrofluoric acid, hydrochloric acid and hydrogen peroxide,
   a main cleaning in a further stage with an aqueous cleaning solution which contains nitric acid and hydrofluoric acid, and
   a hydrophilization of the polysilicon fragments by means of a further stage with an oxidizing cleaning solution.

* * * * *